United States Patent [19]

Boos et al.

[11] Patent Number: 5,364,816
[45] Date of Patent: Nov. 15, 1994

[54] FABRICATION METHOD FOR III-V HETEROSTRUCTURE FIELD-EFFECT TRANSISTORS

[75] Inventors: J. Brad Boos, Springfield; Walter Kruppa, Fairfax, both of Va.

[73] Assignee: The United States of America as represented by the Secretary of the Navy, Washington, D.C.

[21] Appl. No.: 10,947

[22] Filed: Jan. 29, 1993

[51] Int. Cl.$^5$ .......................................... H01L 21/20
[52] U.S. Cl. ..................................... 437/133; 437/29; 437/40; 437/126; 437/65; 437/228; 437/981; 437/984; 156/644; 257/276
[58] Field of Search ............. 156/644; 148/DIG. 161; 437/981, 984, 29, 40, 126, 133, 228, 65; 257/276

[56] References Cited

U.S. PATENT DOCUMENTS

| | | | |
|---|---|---|---|
| 4,289,846 | 9/1981 | Parks et al. | 437/65 |
| 4,578,127 | 3/1986 | Gossard et al. | 156/610 |
| 4,624,740 | 11/1986 | Abrams et al. | 156/644 |
| 4,769,683 | 9/1988 | Goronkin et al. | 357/4 |
| 4,860,068 | 8/1989 | Gossard et al. | 357/16 |
| 4,981,808 | 1/1991 | Hayes | 437/31 |
| 5,060,031 | 10/1991 | Abrokwah | 357/22 |
| 5,079,620 | 1/1992 | Shur | 357/91 |
| 5,081,511 | 1/1992 | Tehrani et al. | 357/22 |
| 5,084,743 | 1/1992 | Mishra et al. | 357/22 |
| 5,084,744 | 1/1992 | Hori et al. | 357/22 |
| 5,087,950 | 2/1992 | Katano | 357/22 I |
| 5,091,759 | 2/1992 | Shih et al. | 357/22 |

FOREIGN PATENT DOCUMENTS

| | | | |
|---|---|---|---|
| 2042424 | 2/1987 | Japan | 437/981 |
| 40716915 | 3/1992 | Japan | 156/644 |

OTHER PUBLICATIONS

P. Ho et al., Extremely High Gain 0.15 μm Gate-Length InAlAs/InGa-As/InP HEMTs, Electronics Letters 27, 325 (vol. 27, No. 4, Feb. 14, 1992).
K. H. G. Duh et al., W-Band InGaAs HEMT Low Noise Amplifiers, 1990 IEEE MTT-S Digest, at pp. 595-598.
Y.—C. Pao et al., Characterization of Surface-Undoped $In_{0.52}Al_{0.48}As/In_{0.53}Ga_{0.47}As/InP$ High Electron Mobility Transistors, IEEE Transactions On Electron Devices, 27, 2165 (No. 10, Oct. 1990).
J. Dickmann et al., Influence of a Surface Layer on DC- and RF- Performance of AlInAs/GaInAs HFETS, IEEE Conf. On InP and Related Materials, 1991, p. 292.
L. F. Lester et al., 0.15 μm Gate–Length Double Recess Pseudomorphic HEMT with $F_{max}$ of 350 GHx, IEEE Technical Digest, 1988, p. 172.
H. M. Macksey, Optimization of the $n^{30}$ Ledge Channel Structure for GaAs Power FET's, IEEE Transactions On Electron Devices, vol. ED-33, No. 11, Nov. 1986.
A. Fathimulla et al., High–Performance InAlAs/InGaAs HEMT's and MESFET's, IEEE Electron Device Letters, 9, 328 (No. 7, Jul. 1988).
S. Tadyon et al., Application of Micro–Airbridge Isolation in High Speed HBT Fabrication, Electronics Letters, 29, 26 (Jan. 7, 1983).
P. M. Smith et al., Microwave InAlAs/InGaAs/InP HEMTs: Status and Applications, IEEE 2nd International Conference On InP and Related Materials Digest, 1990, p. 39.

(List continued on next page.)

*Primary Examiner*—R. Bruce Breneman
*Assistant Examiner*—Ramamohan Rao Paladugu
*Attorney, Agent, or Firm*—Thomas E. McDonnell; Edward F. Miles

[57] ABSTRACT

A heterojunction device, and a method for producing the device. A gate air bridge is formed at the mesa sidewall between the active region and the gate bonding pad to lower the gate leakage current. The device has a double recessed gate to reduce local fields in the vicinity of the gate. The fabrication method uses dielectric intermediate and final passivation layers to optimize the double-recess profile and control the extension of the high-field region between the gate and the drain. This combination increases the breakdown potential of the device, but minimizes the effective gate length of the device, preserving high frequency performance.

11 Claims, 9 Drawing Sheets

OTHER PUBLICATIONS

A. Colquhoun et al., MMICS for Automotive and Traffic Applications, 1992 IEEE GaAs Symposium, pp. 3–6.

S. Tadayon, High Speed Heterojunction Bipolar Transistors. (Abstract of talk scheduled Sep. 21, 1992).

J. Dickmann et al., Novel Fabrication Process for $Si_3N_4$ Passivated InAlAs/InGaAs.InP HFETS, Electronics Letters, 28, 1849 (No. 19, Sep., 1992).

Y.-C. Pao et al., Low Conductance Drain (LCD) Design of InAlAs/InGaAs/InP HEMPTS, IEEE Electron Device Letters, 13, 535 (No. 10, Oct., 1992).

K. B. Chough et al., Comparison of Device Performance of Highly Strained $Ga_{1-x}In_xAs/Al_{0.48}In_{0.52}As$ ($0.53 \leq x \leq 0.90$) MODFETS, Electronics Letters, 28, 329 (No. 3, Jan. 30, 1992).

S. R. Bahl et al., Mesa-Sidewall Gate Leakage in AlAs/InGaAs Heterostructure Field-Effect Transistors, IEEE Transactions On Electron Devices, 39, 2037 (No. 9, Sep. 1992).

E. F. Schubert et al., The Delta-Doped Field-Effect Transistor ($\delta$FET), IEEE Transactions On Electron Devices, vol. ED-33, p. 625 (No. 5, May 1986).

J. K. Abrokwah et al., High-Performance Self-Aligned $p^+/n$ GaAs Epitaxial JFET's Incorporating AlGaAs Etch-Stop Layer, IEEE Transactions on Electron Devices, 37, 1529 (No. 6, Jun. 1990).

K. Lee et al., II-Heterostructure Field Effect Transistors for VLSI Applications, IEEE Transactions on Electron Devices, 37, 1810 (No. 8, Aug., 1990).

P. P. Ruden et al., Quantum-Well, p-Channel AlGaAs/InGaAs/GaAs Heterostructure Insulated-Gate Field-Effect Transistors, IEEE Transactions On Electron Devices, 36, 2371 (No. 11, Nov. 1989).

A. W. Swanson, The Pseudomorphic HEMT, Millimeter & RF, Mar., 1987, p. 139.

S. A. Bahl, Elimination of Mesa-Sidewall Gate Leakage in InAlAs/InGaAs Heterostructures by Selective Sidewall Recessing, IEEE Electron Device Letters, 13, 195 (No. 4, Apr. 1992).

T. J. Drummond, et al., Dependence of Electron Mobility on Spatial Separation of Electrons and Donors in $Al_xGa_{1-x}As/GaAs$ Heterostructures, J. Appl. Phys., 52, 1380 (No. 3, Mar. 1981).

C. B. Cooper et al., Use of Thin AlGaAs and InGaAs stop-Etch Layers for Reactive Ion Etch Processing of III-V Compound Semiconductor Devices, Appl. Phys. Lett., 51, 2225 (No. 26, Dec. 28, 1987).

E. F. Schubert et al., Selectively $\delta$-Doped $Al_xGa_{1-x}As/GaAs$ Heterostructures with High Two-Dimensional Electron-Gas Concentrations $n \geq 1.5 \times 10^{12}$ $cm^{-2}$ for Field-Effect Transistors, Appl. Phys. Lett., 51, 1170 (No. 15, Oct., 1987).

P. Dawson et al., Effects of Prelayers on Minority-Carrier Life-time in GaAs/AlGaAs Double Heterostructures Grown by Molecular Beam Epitaxy, App. Phys. Lett., 45, 1227 No. 11, Dec., '84).

R. Dingle et al., Electron Mobilities in Modulation-Doped Semiconductor Heterojunction Superlattices, Appl. Phys. Lett., 33, 665 (No. 7, Oct., 1978).

H. L. Störmer et al., Dependence of Electron Mobility in Modulation-Doped GaAs-(AlGa)As Heterojunction Interfaces on Electron Density and Al concentration, Appl. Phys. Lett. 39, 912 (No. 11, Dec. 1981).

K. B. Chough et al., High-Performance Highly Strained $Ga_{0.23}In_{0.77}As/Al_{0.48}In_{0.52}As$ MODFET'S Obtained by Selective and Shallow Etch Gate Recess Techniques, IEEE Electron Device Letters, 13, 451 (No. 9, Sep., 1992).

Macksey in "Optimisation of the $n^{30}$ ledge channel structure for GaAs power FETs" IEEE Trans. ED 33(11), Nov. 1986, pp. 1818 1824.

Boos et al. in "InAlAs/InGaAs/InP HEMTs with high breakdown voltages using double recess gate process" Electronics Letters vol. 27(21), Oct. 10, 1991, pp. 1909 1910.

FABRICATION METHOD FOR III-V HETEROSTRUCTURE FIELD-EFFECT TRANSISTORS

FIELD OF THE INVENTION

The invention pertains to a new design and fabrication method for III-V heterostructure field-effect transistors (HFETs) to improve their high-frequency performance, in particular their breakdown voltages, output conductance, maximum power output, and efficiency.

BACKGROUND OF THE INVENTION

HFETs fabricated using III-V semiconductors have a variety of potential applications in the fields of high-speed logic, microwave and millimeter-wave circuits, and optoelectronics. The HFET differs from a homostructure FET in that the device structure includes materials with different band gaps to obtain higher performance levels which would otherwise be unattainable. The composition and doping of each material used in the structure can also be varied. This high degree of design freedom has resulted in HFETs which have significantly improved performance at increasingly high frequencies. Even though work on HFETs is relatively new, definite trends in device design for improved performance can be observed. One trend is the use of a material with a relatively wide-band gap ($Al_xGa_{1-x}As$, $In_xAl_{1-x}As$, AlSb) together with a material with a relatively narrow-band gap (GaAs, $In_xGa_{1-x}As$, InAs) to maximize the conduction band discontinuity within the structure. The wide-band gap material is also employed to obtain a quality Schottky-barrier gate characteristic. In the narrow band-gap material, there is a trend toward using increasingly high In mole fractions to increase the electron mobility and velocity within the device. A further trend is to use increasingly higher doping densities and very thin channels because this allows for improvement in the transconductance and the gate-channel aspect ratio (gate length/gate-channel distance) which together improve the high-frequency performance. When comparing an HFET to a homostructure FET, the two structures are quite different in the starting materials used. However, the fabrication process commonly reported for both cases is the same. Due to the trends indicated above, a different fabrication method may be necessary to fully exploit the improved performance potential in HFETs.

Limitations of conventional InP-based HFETs include excessive gate leakage current related to the low barrier height of the Schottky gate, low gate-drain breakdown voltage, low source-drain breakdown voltage, and high output conductance. These limitations have impeded the use of these devices in power amplifiers, where large breakdown voltages are required, or as low-noise amplifiers in photoreceivers, where low leakage current is essential.

A mesa etch is conventionally used at the beginning of an HFET process for the purpose of confining the electron flow between the source and the drain. This requires the gate metalization, which is formed later in the process, to traverse the mesa edge. As the gate metal traverses the mesa edge, it contacts the narrow-band gap material (FIG. 15). This has the effect of lowering the Schottky barrier height of the gate metal and significantly increases the reverse leakage current of the HFET.

In conventional HFETs, the mesa-edge region can also be the location where gate-drain and source-drain breakdown originates, due to the high localized fields which can occur here relative to other areas in the device. The high fields in this sidewall region can result from (1) the sharp change in the shape of the channel profile, (2) deleterious surface trapping effects which occur due to the mesa etch chemical process in conjunction with the exposed heterojunction layers at the sidewall, (3) deleterious surface trapping effects due to the dielectric passivation at the sidewall, and (4) deleterious metallic diffusion effects in this region which result from the ohmic contact alloy process. By surface trapping effects it is meant any effect at the material's surface which can alter charge profiles, and can be due, for example, to imcomplete surface bonds, contaminants, etc. Surface trapping in the gate-drain region can decrease the gate-drain breakdown potential, reducing the HEMT's operating voltage range.

HFETs with very high electron concentrations and thin channels have relatively low gate-drain and source-drain breakdown voltages because of the high fields generated, the close proximity of the highly-doped cap layer, and the influence of the surface potential in the gate-drain region. The surface potential in the vicinity of the gate plays a critical role in determining both gain and power performance, since it also affects the shape of the electric field in this region. An optimized surface potential can relax the field profile at the drain side of the gate and result in high breakdown voltages and lower output conductance. The surface potential is influenced by the total number and type of surface states which are present, and the contour of the surface profile in this region. The total number and type of surface states are determined by (first) the quality of the material at the start of the process, (second) the effects of chemical and physical processes which occur as a result of device processing prior to, during, and after the gate recess step, (third) the presence, or lack thereof, of a dielectric passivation layer covering this surface, and (fourth) the pretreatment of the surface prior to passivation, assuming that a passivation layer is employed.

SUMMARY OF THE INVENTION

Accordingly, an object of the invention is to increase the operating voltage range of such devices and hence increase the power output and efficiency without degrading frequency response.

Another object is to do this by reducing electric fields in the vicinity of the gate-drain region.

Another object of the invention is to increase the Schottky-barrier breakdown in such devices.

Another object is to permit separation of the gate metalization of such devices from the active regions of the devices at the mesa sidewall, most especially the narrow band-gap heterojunction material.

In accordance with these and other objects made apparent hereinafter, the invention is directed to a semiconductor device, such as HEMT, in which the mesa etch used to isolate the active part of the device is performed after the gate metal is in place, and serves to form an air-gap between the gate and gate bonding pad. This physically separates the gate metal from, inter alia, the device's channel, which minimizes leakage current, and increases the device's breakdown voltage by isolating the gate metal from surface charge on the mesa sidewall. The semiconductor channel in the vicinity of the gate stripe is recess-etched twice in order to lower the high localized field in the gate-drain region, which can sharply affect breakdown voltage, but because of the fabrication sequence employed, does so without excessively increasing the extension of the high-field region between the gate and the drain, thus maintaining high frequency performance.

More particularly, the use of a double-recessed channel geometry alters the field profile at the drain edge of the gate and, therefore, can result in an increase of the gate-drain and the source-drain breakdown voltages and a decrease of the output conductance. This can, in turn, increase maximum output power and efficiency. By controlling the extension of the high-field region between the gate and the drain, the maximum gain of the HFET can also be improved. The formation of a double-recess channel geometry which uses a dielectric as an intermediate layer between the gate-level photoresist and the semiconductor permits formation of the double-recess gate structure using a single gate lithography step and a combination of etching steps. The dielectric layer also serves to protect the surface from chemical and physical effects which result from wafer processing and helps control the surface potential in the gate-drain region. A conventional double-recess process requires two lithography steps, and may result in a different shape of the double-recess profile, and a different surface-state density in the gate-drain region. Additionally, the additional gate lithography step makes the process more complicated and difficult to control.

These and other objects are further explained in the following detailed description of preferred embodiments. Plainly, though, the invention is capable of extended application beyond the specific details of these embodiments. Changes and modifications can be made that do not affect the spirit of the invention, nor exceeds its scope, as set forth in the appended claims. The invention is described with particular reference to the accompanying drawings, wherein:

DETAILED DESCRIPTION

Figure 1:
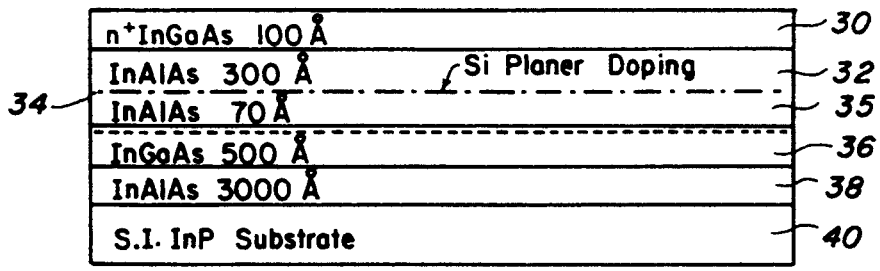
FIGS. 1-14 are schematic views illustrating fabrication of a HEMT according to the invention.
Figure 2:
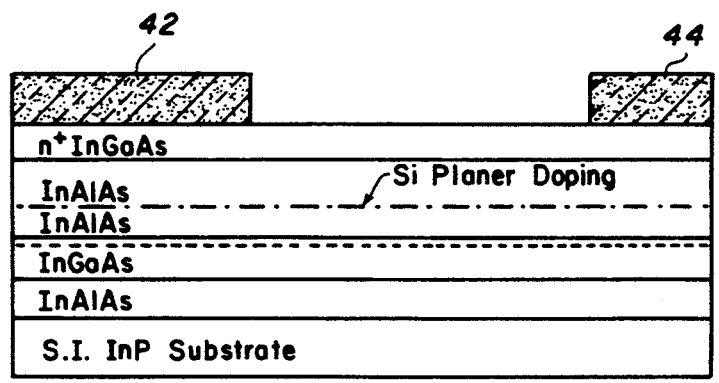
Figure 3:
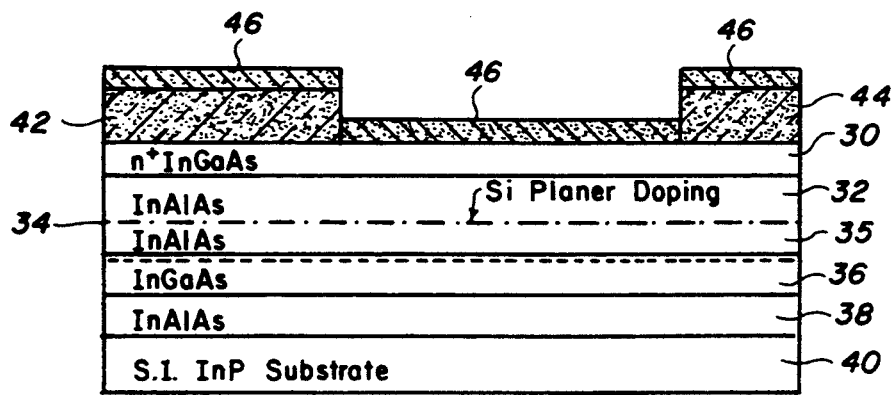

With reference to the drawing figures, wherein like numbers indicate like parts throughout the several views, FIGS. 1-14 illustrate an exemplary device according to the invention, and the method of its fabrication. With particular reference to FIGS. 1-3 device fabrication begins with a heterostructure sample, comprising a heterojunction formed between narrow band-gap channel layer 36, and a wide band-gap layer 35. The heterojunction rests ultimately on a semi-insulating InP substrate 40, and separated therefrom by a InAlAs buffer layer 38. Atop wide band-gap layer 35 is an planar-doped Si layer 34 and another InAlAs wide band-gap layer 32. Atop the wide band gap layer 32 is a n+doped InGaAs cap layer 30.

Figure 6:
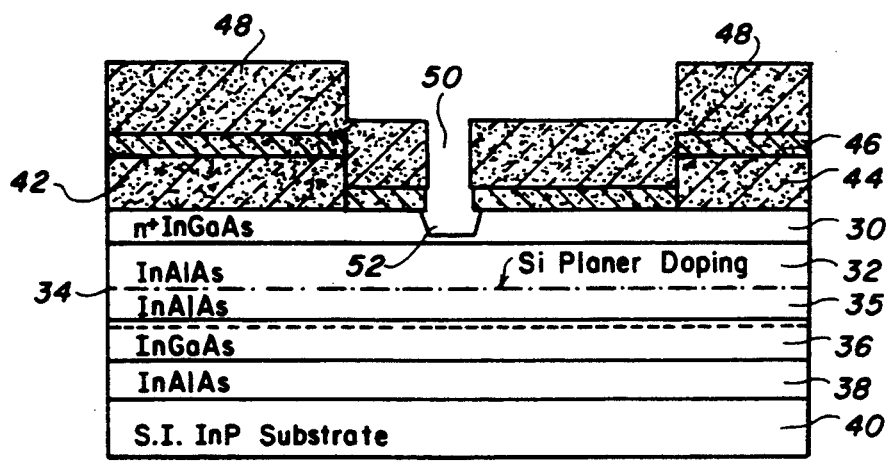
Figure 7:
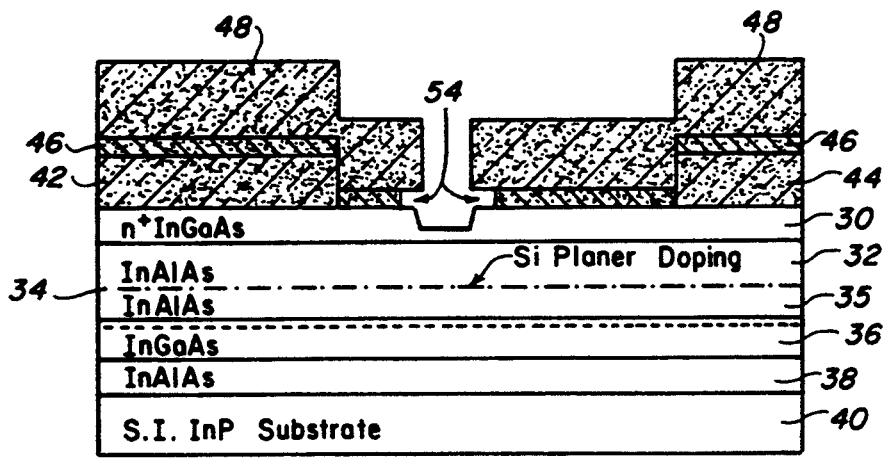
Figure 8:
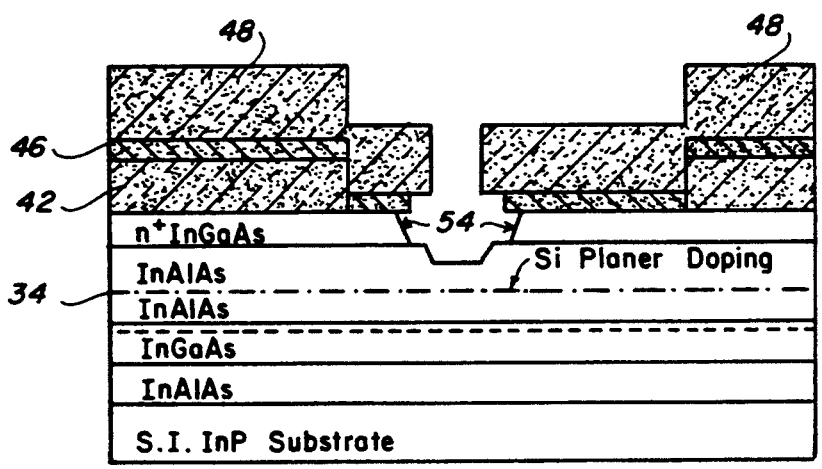
Figure 9:
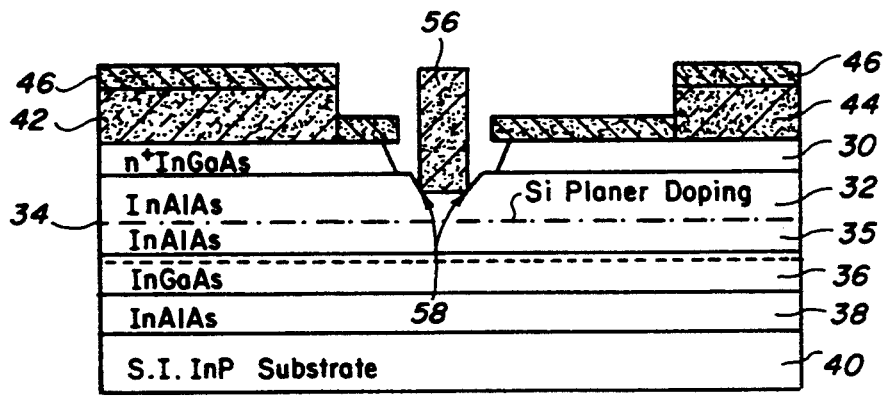

Source and drain metalization 42, 44 are formed (as shown in FIG. 2) and preferably heat treated to minimize contact resistance of the ohmic contact metalization 42, 44. A dielectric layer 46 is then deposited on the sample by any conventional means (FIG. 3). Layer 46 is preferably $Si_3N_4$ because it is an excellent surface passifier. The $Si_3N_4$ layer is preferably deposited by plasma-enhanced chemical vapor deposition (PECVD) of $SiH_4 + N_2$ to minimize damage to the surface of layer 30 that would produce surface trapping. In addition to playing a key role in the formation of the optimum double-recess profile, silicon nitride layer 46 also protects the surface of the sample's gate-drain region from chemical reactions or contaminants which result from subsequent gate photolithography processing, discussed below. Photoresist 48 is applied over silicon nitride 46, and a gate window 50 is defined in photoresist 48 (FIG. 4) in any conventional manner. Because the mesa etch is moved to the last step of the process, the gate and source-drain lithography steps are simplified considerably, with commensurate yield improvements, due to the ability to now perform photolithography on a planar surface. Using photoresist 48 as a mask, gate pattern 50 is transferred into the silicon nitride using any known technique that will reproduce the mask with fidelity (n.b.—will not undercut nitride 46 significantly), most preferably a reactive ion etchant containing no oxygen, such as $CF_4$, and at minimum practical power to minimize surface damage. The sample is chemically etched in any known manner to form the first gate recess 52 (FIG. 6). The silicon nitride intermediate layer 46 is intentionally undercut in the lateral direction 54 preferably using a standard plasma etchant, such as $SiF_4 + O_2$ to minimize surface damage (FIG. 7). The sample is given a second chemical etch in essentially the same manner as the first etch, to form a double recess structure i.e., having a recess in layer 32, and a laterally wider recess in layer 30. (FIG. 8). Thereafter, one preferably removes residue surface oxides using, for example, an ammonium hydroxide etchant, and another rinse in deionized water. Gate metal 56 is deposited by, for example, thermal evaporation and the sample sprayed with a material such as acetone to remove photoresist 48. This leaves gate metal stripe 56 self-aligned with the edge of layer 32 at deep recess edges 58 (FIG. 9). This self-aligned method is especially critical to the performance of HFET's, because both the maximum gain and the maximum output power of HFETs are determined primarily by the design of this region, assuming that other parasitic resistances and capacitances are properly minimized. Too much separation between gate metal 56's edge and deep recess edge 58 can result in a larger effective gate length due to the lateral spreading of the depletion region under gate 56 in layer 32, and large gate-source and gate-drain fringing capacitances. The larger effective gate length reduces the maximum frequency at which the device will operate.

The electric field profile in the vicinity of 54 plays a dominant role in the gate-drain and source-drain breakdown voltages that occur in the device. If n+cap layer 30 is in close proximity to gate metal 56, as in the case with the conventional single recess process, breakdown in the device occurs at lower voltages, which adversely affects power performance. With n+layer 30 intentionally set back from the gate as with the double-recess 54, higher breakdown voltages are achieved because the electric field in that vicinity is reduced due to a relaxation in the field profile at the drain side of the gate.

Figure 10A:
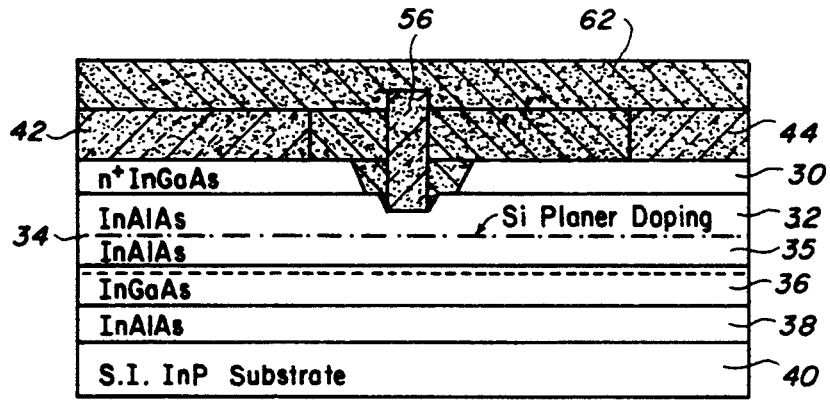
Figure 10B:
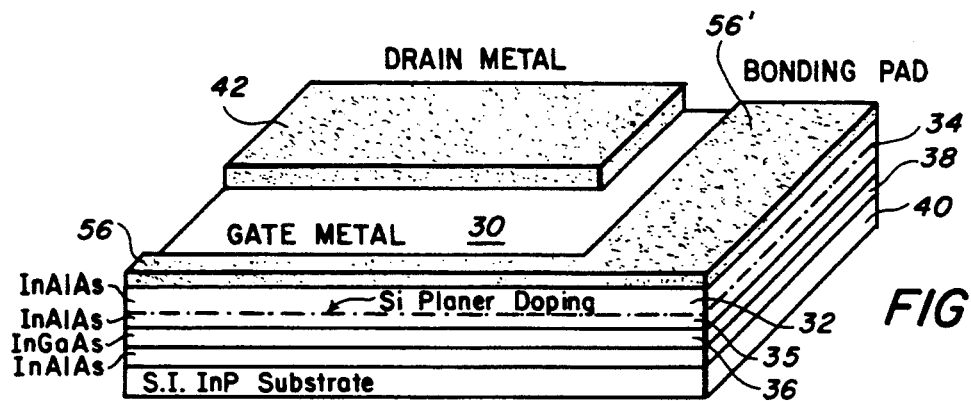
Figure 10C:
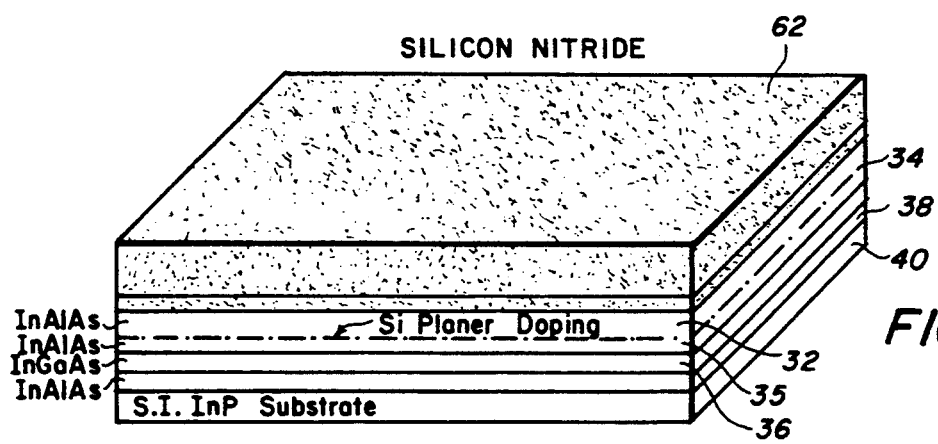

The contour of the surface profile in the vicinity of 54, which also directly affects the field profile, is determined by the gate recess process design. In the double-recess process described herein, both chemical and plasma etch processes are utilized, which affect both the contour of the surface profile and the number and type of the surface states which are present. Immediately after gate deposition, a second silicon nitride layer 62 is deposited for passivation of the surface which was exposed as a result of forming gate recess 54 (FIG. 10A). Layer 62 helps to further control surface potential at layer 30 and prevents additional chemical reactions at surface 30 due to subsequent processing. The wide-band gap semiconductors typically employed in HFET's contain Al which causes them to be highly susceptible to chemical reactions. If the exposed surface is not passivated after the gate process, the effect on the surface potential due to down stream processing can severely degrade performance. Application of passivation layer 60 preferably comes before the air-gap mesa etches, discussed below because further chemical processing would precipitate formation of surface states, and markedly diminish performance.

Any one of the above factors, if not controlled, can result in lowering the breakdown voltage of the device and thus limiting its high frequency power performance. Optimizing the gate process for high breakdown, for example by using a larger distance between gate 56 and n+cap layer 30, or using an undoped cap instead of an n+ cap, may reduce the gain of the device. The gate recess and nitride passivation process described herein optimize these trade-offs markedly for both high-frequency and high-power performance.

Figure 11:
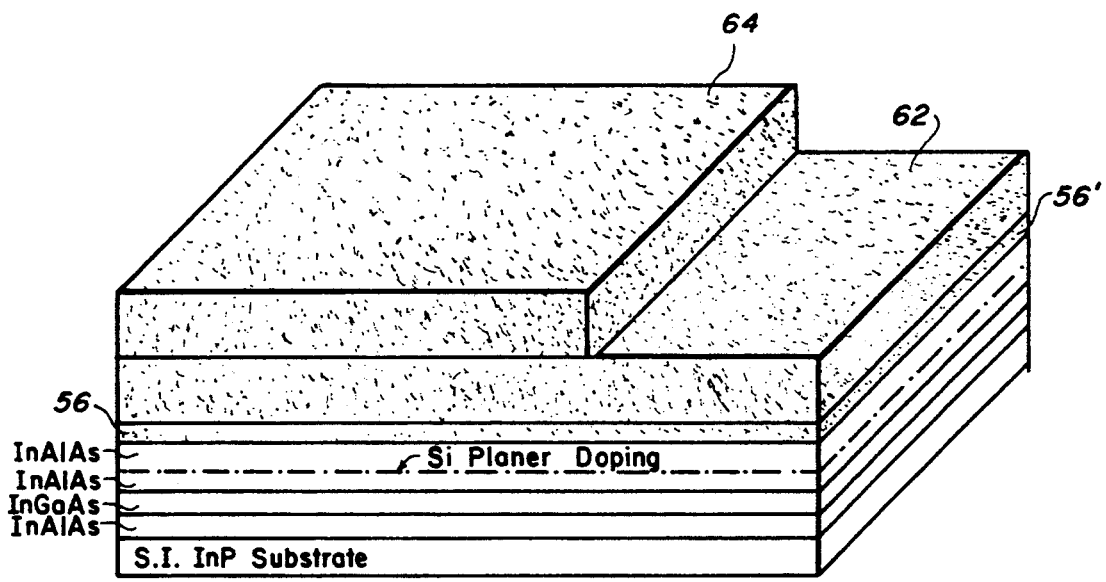
Figure 12:
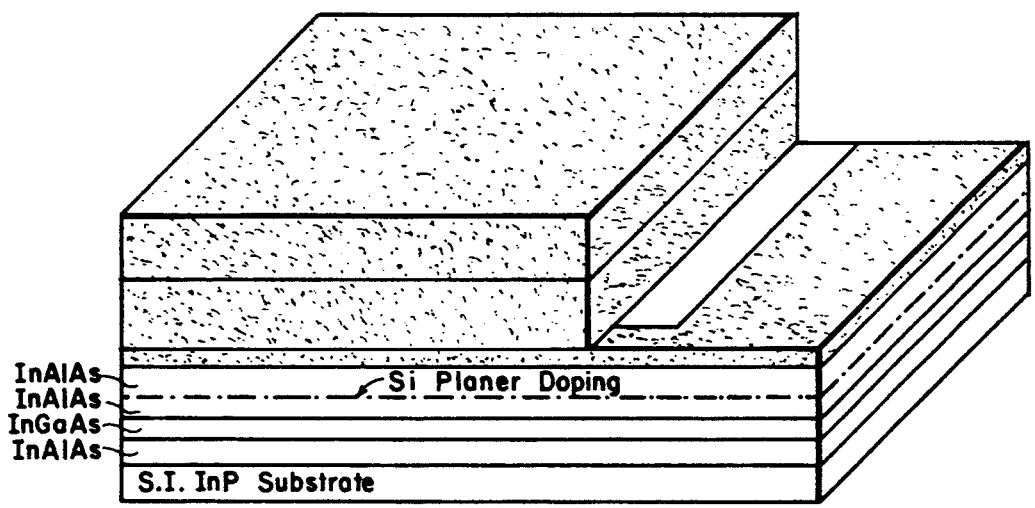
Figure 13:
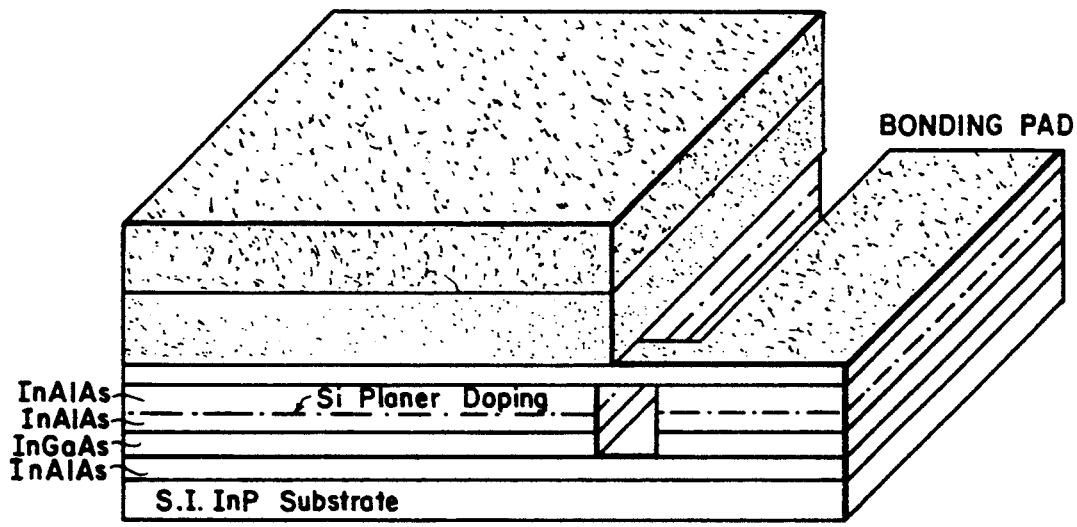
Figure 14:
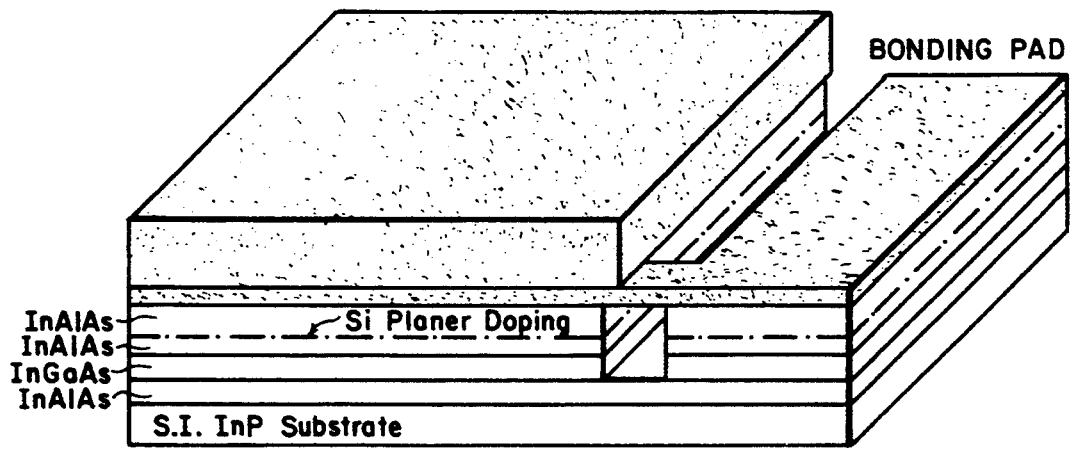

After the gate recess process and nitride deposition, an air-gap is formed between the device's active layers and the gate bonding pad 56, as illustrated in FIGS. 10–14. After gate metal deposition, the HFET is completely covered with a conventional thickness 62 of dielectric to passivate the surface (FIG. 10C). Silicon nitride layer is the prefered dielectric, again because of its superior passivation qualities. For illustrative purposes, FIG. 10B shows the configuration of drain metal 42 the gate metal stripe 56 and the gate bonding pad 56' for this cross sectional top view, with nitride cover 60 removed. Photoresist layer 64 is patterned on the sample to act as an etch mask (FIG. 11). Silicon nitride layer 62 is etched away using any conventional method selected to minimize undercutting, or erosion of gate metal (FIG. 12), for example $SiF_4$ plasma etch. Although not shown in FIG. 12, windows in nitride 62 above source and drain metalizations are also preferably etched at this step for contacting purposes. Using nitride 62 and gate metal bonding pad 56' as a mask, the sample is then chemically etched down to the InAlAs buffer layer 38 (FIG. 13) using an etchant which permits a short dip time, for example an appropriate solution of $H_3PO_4$ and $H_2O_2$ in water. During this chemical etch, the material between gate stripe 56 at the mesa edge is removed due to the undercut etching of the chemical etch. Consequently, mesa isolation and air-bridge gate formation preferably occurs simultaneously during the same chemical etch step. The photoresist is removed, which results in the completed structure shown in FIG. 14. Using this approach, the number of photolithographic steps are the same as with the conventional process. This process can also be applied to most homojunction and heterojunction FET processes, including FETs which employ GaAs, InP, InGaAs, and InAs channels. The gate air bridge process can also be applied to heterojunction bipolar transistors in which the vertical nature of the structure presents particular processing difficulties associated with the need for connecting the emitter, base, and collector metalizations to their respective off-mesa bonding pads, with the necessity for isolation between them.

Figure 15:
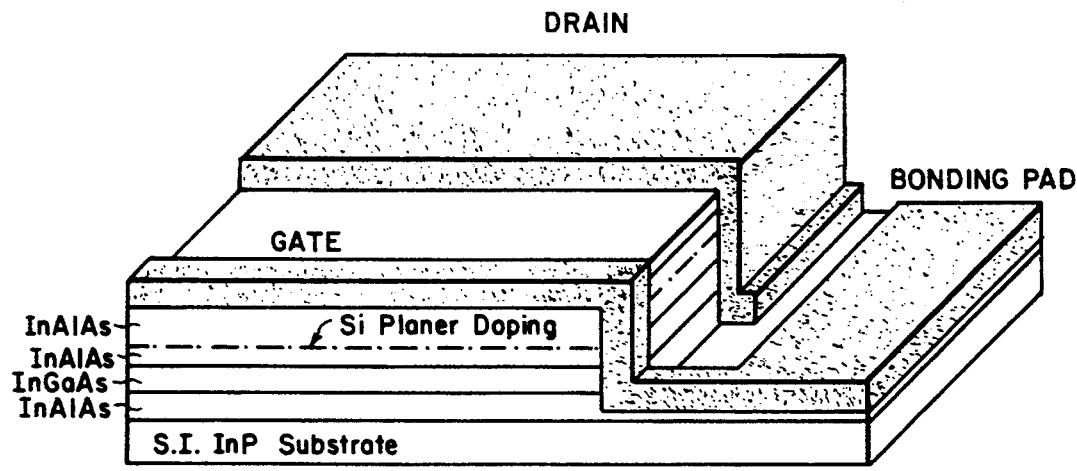
FIGS. 15-17 are side sectional views (with overcoating layers removed) illustrating finished HEMT's.
Figure 16:
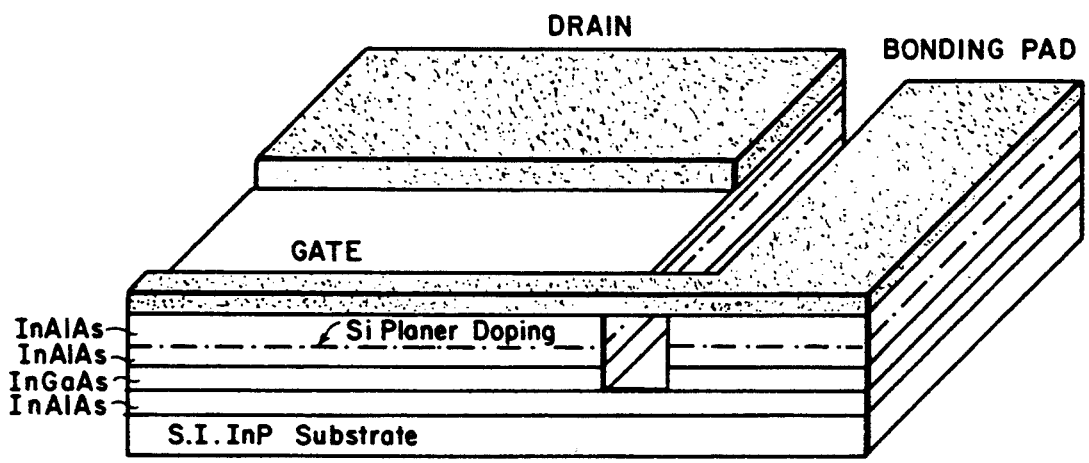

The resulting cross section of a typical HFET formed using the mesa etch at the end of the process is shown in FIG. 16. Gate contact only rests on top of the wide-band gap material, and results in a gate with a higher Schottky barrier height and thus an improved gate characteristic. This is especially important when trying to maximize output power and efficiency since a gate diode with a lower reverse leakage current allows a large gate-drain voltage to be sustained. The movement of the mesa etch to the end of the process can also lead to higher gate-drain and source-drain breakdown voltages due to a reduction of the localized high-field regions which can occur at the mesa edges of the channel. Typically, with the mesa etch being performed at the start of the process, the source, gate, and drain metals all transverse the mesa edge (FIG. 15). The resulting field, which is also affected by the sidewall surface potential, can cause premature gate-drain and source-drain breakdown in the device. With the air-bridge gate, the source, gate, and drain metalizations do not traverse the mesa edge and thus allow for a reduction in the localized field in these regions. The air-bridge gate also gives a large forward turn-on voltage of the Schottky diode which allows for a large signal swing in power applications and increased noise margin in digital applications.

Figure 17:
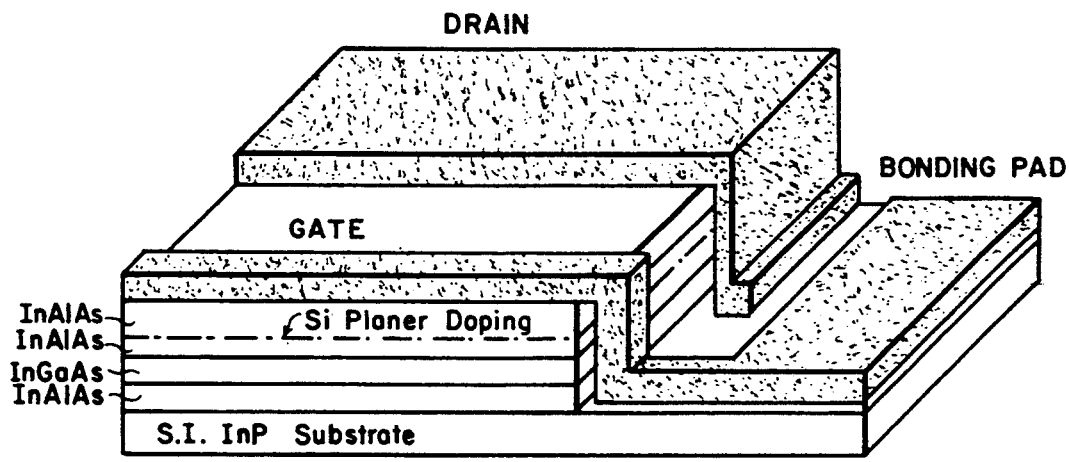

The air-bridge gate process described herein can also be used in combination with a conventional mesa isolation process. In this case, a conventional mesa isolation etch is performed at the beginning of the process and a sidewall undercut etch at the mesa edge is performed at the end of the process resulting in a vertical air-bridge gate structure, as shown in FIG. 17. This may have the advantage of minimizing the gate bonding pad capacitance since, in this case, the conducting layer is removed from beneath the gate bonding pad. This, however, has the disadvantage of requiring an additional photolithography step.

EXAMPLE

Figure 4:
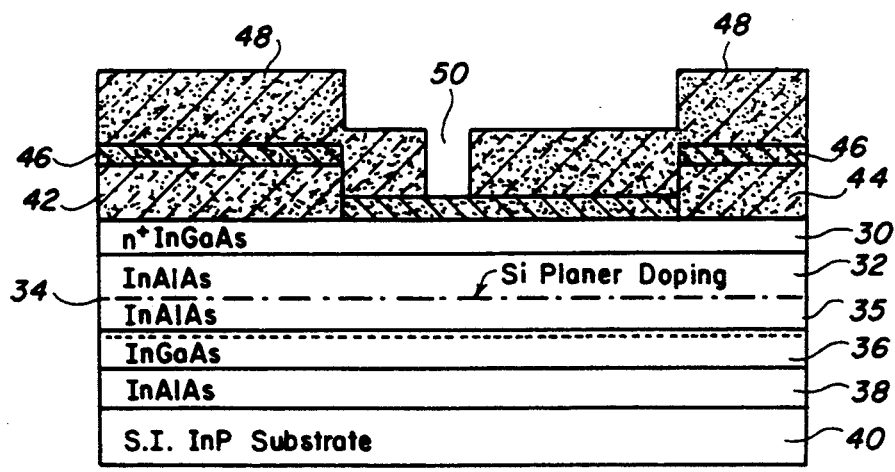
Figure 5:
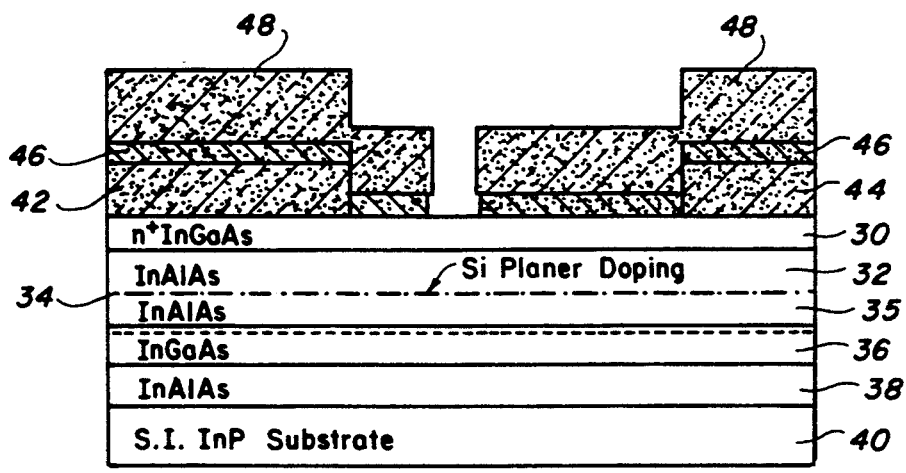

HEMT's of the kind described above were fabricated in the manner discussed above. The $In_{0.52}Al_{0.48}As/In_{0.53}Ga_{0.47}As$ HEMT material was grown by MBE at 500° C. on Fe-doped, semi-insulating, (100) InP. The growth sequence started with a 3000 Å InAlAs buffer layer, following by a 500 Å undoped InGaAs channel layer. This was followed by a 70 Å InAlAs undoped spacer layer, a Si planar-doped layer, a 300 Å InAlAs undoped layer, and a 100 Å InGaAs n+cap layer. A cross section of the starting material is shown in FIG. 4. The sheet charge density and mobility of the starting material, determined by room-temperature Hall measurements, were $2.1 \times 10^{12} cm^{-2}$ and 10,500 $cm^2/V$-s, respectively. The HEMT's were fabricated using the standard photolithographic and liftoff techniques described above. Single and double gate recess HEMT's were identically fabricated, for comparison of results.

The initial $Si_3N_4$ layer was about 3000Å, deposited by plasma-enhanced chemical vapor deposition at 200° C. of $SiH_4+N_2$. The initial gate etch (following application of photoresist corresponding to layer 48 of the drawings) was done by reactive ion etching using $CF_4$ at 25 mT, 50 W for 15 min. The subsequent chemical etch to form the gate recess (corresponding to recess 52) was done using a 1:1:200 solution of ($H_3PO_4:H_2O_2$:

$H_2O$) for 6 sec., followed by a rinse in deionized water. The lateral undercutting of the initial $Si_3N_4$ layer was done by a $SiF_4$:2% $O_2$ plasma etch at 0.8 T, 20 W, for 20 sec. The second chemical etch, to complete the double recess, was done using a 1:1:200 ($H_3PO_4$:$H_2O_2$:$H_2O$) solution for 10 sec. and a 15 sec. rinse in deionized water.

The second nitride layer was 1000Å of $Si_3N_4$ formed by PECVD, $SiF_4$:2% $O_2$ at 0.8 T and 25 W for 2 min. The air bridge was cut by a 1:1:8 ($H_3PO_4$:$H_2O_2$:$H_2O$) solution for 20 sec.

Figure 18:
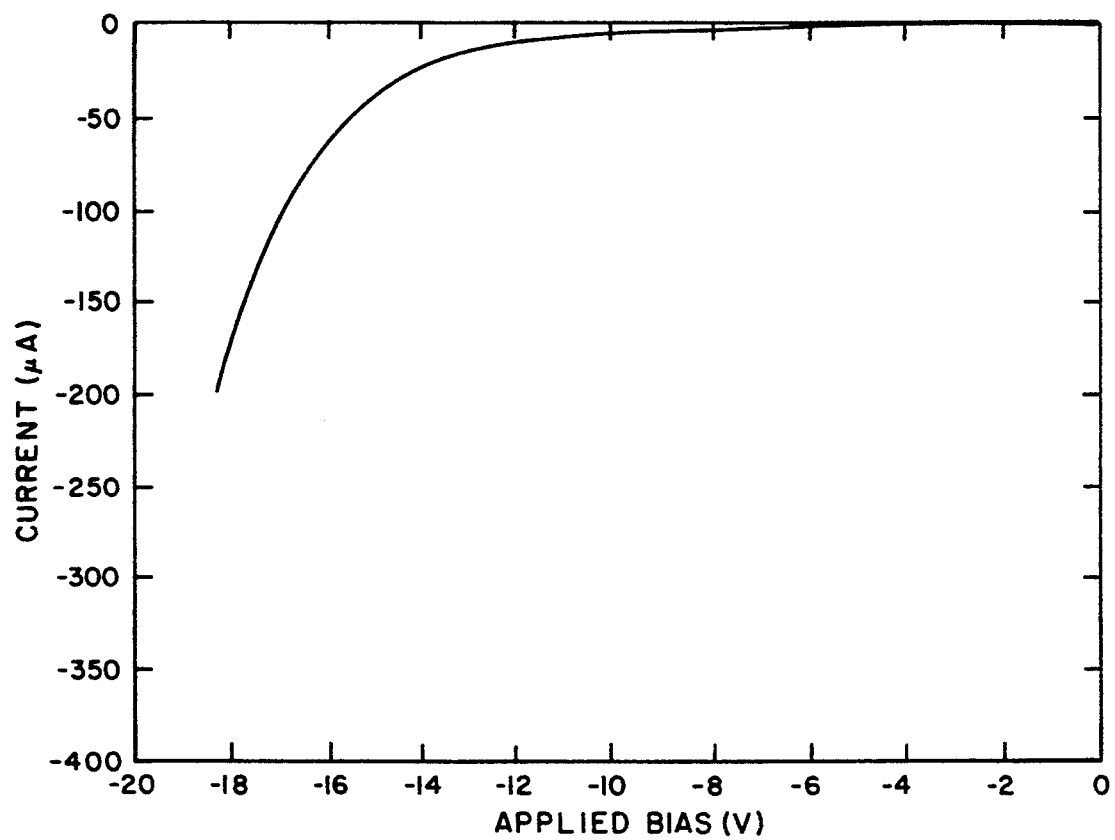
FIGS. 18-19 are graphs presenting test results on HEMT's fabricated according to the invention.

The gate-source and gate-drain spacings in the devices were 0.6 μm and 1.8 μm, respectively. The source and drain metals were AuGe/Au(1000Å/1000Å). After metalization, the sample was heat treated at 380° C. for 30 sec. to produce low contact resistance. The gate length was 1.4 μm and the total gate widths were either 90 μm or 240 μm. Typical values of the gate-drain breakdown voltage, which is defined as the voltage with 1 mA/mm leakage current, were 9 V and 13 V for the HEMT's fabricated using the single and double gate recess process, respectively. A maximum breakdown voltage of 16 V was observed for the double-recess case. The reverse I-V characteristic of the gate-drain diode showing the 16 V breakdown voltage is shown in FIG. 18.

The reverse characteristics achieved in the HEMT's are the result of several factors. The use of an air-bridge gate process at the mesa edge significantly reduces the gate leakage current which results from the gate metal contacting the low-barrier height InGaAs channel. An undoped InAlAs layer is used for the gate contact which also minimizes the gate leakage current. The use of planar-doping reduces the electric field under the gate compared to the uniformly doped-case with the same gate-to-channel spacing. The electric field is further reduced in the double-recess case due to a relaxation in the field profile at the drain side of the gate, which results from the optimization of a variety of processing issues which were discussed earlier.

Figure 19:
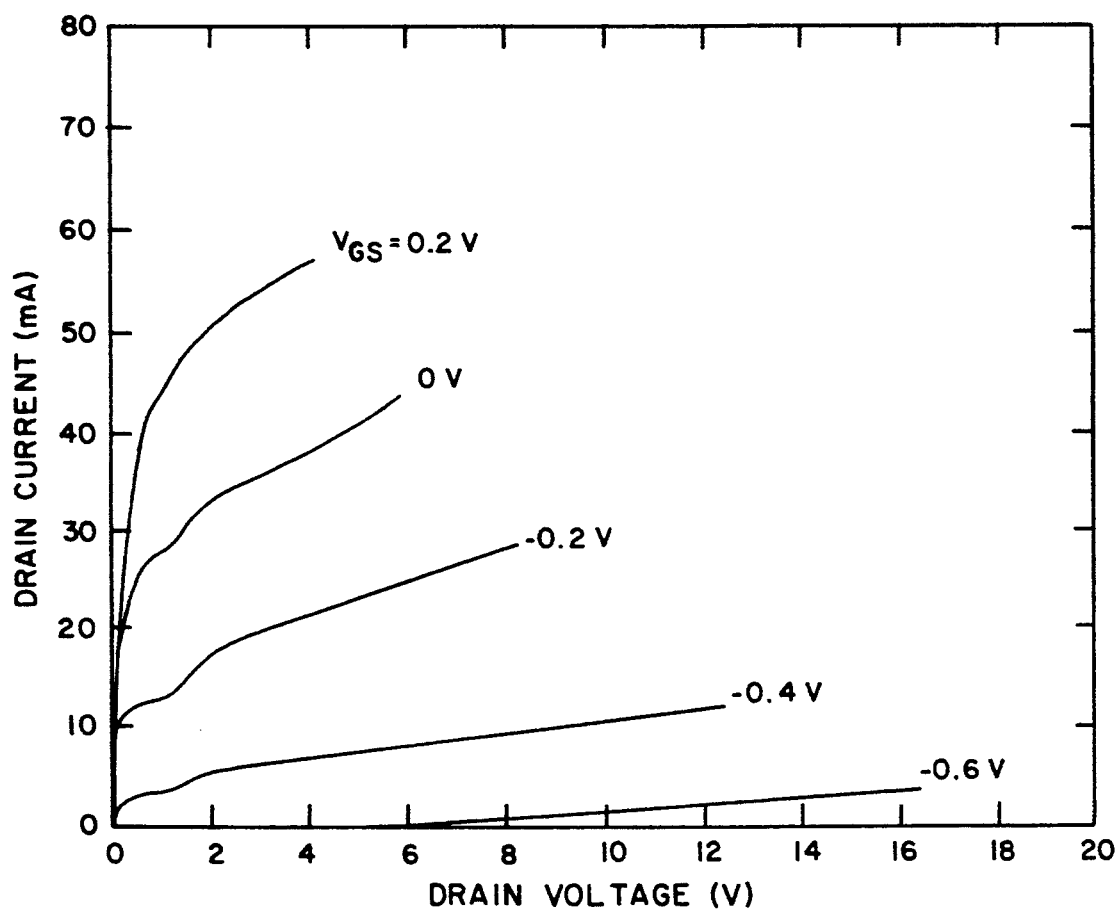

The drain characteristics for the double-recessed HEMT are shown in FIG. 19. The device exhibits a pinch-off voltage of 0.6 V and a saturated drain current of 230 mA/mm at $V_{GS}$=0.2 V and $V_{DS}$=4 V. At $V_{GS}$=O V and $V_{GS}$=4 V, the maximum dc extrinsic transconductance is 360 mS/mm. The source resistance is 1 ohm-mm, which yields an intrinsic transconductance of 560 mS/mm. The device displays a typical kink phenomenon at a low drain voltage. The source-drain breakdown voltage of the double-recessed HEMT's at the pinch-off condition is greater than 16 V. At $V_{DS}$=16 V and $V_{GS}$=−0.6V, the drain current is 3 mA. To our knowledge, the maximum gate-drain and source-drain breakdown voltages achieved by this device are the highest values reported for an InAlAs/InGaAs/InP HEMT. The drain characteristics of the HEMT's for the single recess case are comparable except that the source-drain breakdown voltage is several volts lower.

On-wafer microwave characterization was performed on the devices from 1 to 18 GHz. Based on the measured S-parameters and equivalent circuit modeling, a maximum RF transconducance of 400 mS/mm was obtained for the double-recessed HEMT's. A maximum $F_T$ of 16 GHz and $F_{max}$ of 40 GHz were achieved at 2 V and 4 V, respectively. When biased to achieve the highest $F_{max}$ value, a low RF output conductance of 6 mS/mm was obtained, indicating good electron confinement in the channel. The corresponding voltage gain is 67. The RF results for the single recess are comparable. The output conductance value is among the lowest values reported for InAlAs/InGaAs/Inp HEMT's employing a similar gate length.

A paper entitled "InAlAs/InGaAs/InP HEMT's with High Breakdown Voltages using a Double-Recess Gate Process" reports the performance results of this work. The paper was published in the IEE Electronics Letters Journal in an issue dated Oct., 1991. The specific details of the fabrication methodology were omitted from the paper. The paper is incorporated herein by reference.

The feasibility of the process was demonstrated using an InAlAs/InGaAs/InP high electron mobility transistor (HEMT). However, the fabrication method is applicable to a variety of both homostructure and heterostructure FETs. Indeed, the invention has been described in what is considered to be the most practical and preferred embodiments. It is recognized, however, that obscure modification may occur to those skilled in this area. Accordingly, the scope of the invention is to be discerned solely by reference to the appended claims, wherein:

We claim:

1. A method of fabricating a heterojunction semiconductor device which includes a source, drain, gate and a channel, said method comprising the steps of:

epitaxially growing a sample with a heterojunction, said heterojunction having a first and a second layer of semiconductor material, said first layer being of a smaller bandgap material that of said second layer;

forming a third layer of semiconductor material on said second layer;

forming source and drain metalizations on top of said third layer;

growing a first insulating layer on of said metalizations;

applying a photoresist layer atop said first insulating layer and delineating a gate opening in said photoresist above said first insulating layer;

using said opening as a mask for forming a corresponding gate recess in said first insulating layer;

forming a gate recess in said third layer;

a first widening step, said first widening step being effective to cause said gate opening to be preferentially widened with respect to said gate recess in said third layer in a direction generally parallel to said third layer to increase the width of said gate opening in said first insulating layer;

a second step for widening, said second stop for widening being effective to form a gate recess of a first width in said second layer, and a gate recess of a second width in said third layer, said second width being larger than said first width;

providing gate metalization, said gate metalization comprising a gate stripe and a gate bonding pad, said stripe being disposed in said gate recess in said second layer;

growing a second insulating layer on said source, drain and gate metalizations;

applying a photoresist layer atop said second insulating layer and delineating a mesa photoresist opening above said second insulating layer; and forming a mesa through each of said layers effective to dispose an air-gap in said layers between said stripe and said pad.

2. The method of claim 1 wherein the heterojunction region of said layered sample includes an epitaxially grown undoped layer as the narrow bandgap layer and epitaxially grown doped layer as the wide bandgap material, whereby a HEMT device is produced.

3. The method of claim 1 wherein the heterojunction region of said layered sample includes an epitaxially grown doped layer as the narrow bandgap layer and epitaxially grown undoped layer as the wide bandgap material, whereby a HFET device is produced.

4. The method of claim 1 wherein the said layered sample includes the same material for the narrow bandgap layer as for the wide bandgap material, whereby a FET device is produced.

5. The method of claim 1 wherein the epitaxially grown narrow bandgap layer is InGaAs and epitaxially grown wide bandgap material is InAlAs.

6. The method of claim 1 wherein said first and said second insulating layers are $Si_3N_4$.

7. The method of claim 6 wherein said forming of said corresponding gate recess in said first insulating layer is done by $CF_4$ reactive ion etching.

8. The method of claim 1 wherein said second widening step is done by $H_3PO_4:H_2O_2:H_2O$ etching.

9. The method of claim 6 wherein said first widening step is done by $SiF_4:2\%O_2$ plasma etching.

10. The method of claim 1 wherein said step of forming a mesa is done by $H_3PO_4:H_2O_2:H_2O$ etching.

11. A method of fabricating a heterojunction semiconductor device which includes a source, drain, gate and a channel, said method comprising the steps of:

epitaxially growing a sample with a heterojunction, said heterojunction having a first and a second layer of semiconductor material said first layer being of a smaller bandgap material than that of said second layer;

forming a third layer of semiconductor material on said second layer;

forming source and drain metalizations on top of said third layer;

growing a first insulating layer on said layer and said metalizations;

applying a photoresist layer atop said first insulating layer and delineating a gate opening in said photoresist above said first insulating layer;

using said opening as a mask for forming a corresponding gate recess in said first insulating layer;

forming a gate recess in said third layer;

a first widening step, said first widening step being effective to cause said gate opening to be preferentially widened with respect to said gate recess in said third layer in a direction generally parallel to said third layer to increase the width of said gate opening in said first insulating layer;

a second widening step, said second widening step being effective to form a gate recess of a first width in said second layer, and a gate recess of a second width in said third layer, said second width being larger than said first width and larger than said gate recess in said insulating layer, wherein said insulating layer is undercut by said gate recess of said second width;

providing gate metalization, said gate metalization comprising a gate stripe and a gate bonding pad, said stripe being disposed in said gate recess in said second layer;

following said step for providing gate metalization, growing a second insulating layer on of said source, drain and gate metalizations;

applying a photoresist layer atop said second insulating layer and delineating a mesa photoresist opening above said second insulating layer; and forming a mesa through each of said layers effective to dispose an air-gap in said layers between said stripe and said pad.

* * * * *